(12) United States Patent
Granot

(10) Patent No.: US 11,556,062 B2
(45) Date of Patent: Jan. 17, 2023

(54) SUB-RESOLUTION IMAGING TARGET

(71) Applicant: KLA Corporation, Milpitas, CA (US)

(72) Inventor: Asaf Granot, Lotem (IL)

(73) Assignee: KLA Corporation, Milpitas, CA (US)

( * ) Notice: Subject to any disclaimer, the term of this patent is extended or adjusted under 35 U.S.C. 154(b) by 13 days.

(21) Appl. No.: 17/230,963

(22) Filed: Apr. 14, 2021

(65) Prior Publication Data
US 2022/0299885 A1    Sep. 22, 2022

Related U.S. Application Data

(60) Provisional application No. 63/162,631, filed on Mar. 18, 2021.

(51) Int. Cl.
*G03F 7/20* (2006.01)
*H01L 21/66* (2006.01)

(52) U.S. Cl.
CPC ........ *G03F 7/70633* (2013.01); *G03F 7/7065* (2013.01); *H01L 22/12* (2013.01)

(58) Field of Classification Search
CPC ..... G01B 11/14; H01L 22/12; G03F 7/70633; G03F 7/7065
See application file for complete search history.

(56) References Cited

U.S. PATENT DOCUMENTS

| | | |
|---|---|---|
| 2006/0098199 A1 | 5/2006 | Nikoonahad et al. |
| 2011/0170091 A1 | 7/2011 | Chang et al. |
| 2013/0162996 A1 | 6/2013 | Straaijer et al. |
| 2016/0117847 A1 | 4/2016 | Pandev et al. |
| 2016/0274472 A1* | 9/2016 | Mathijssen ............... G03F 7/22 |
| 2018/0321599 A1 | 11/2018 | Bozkurt et al. |
| 2018/0329307 A1* | 11/2018 | Brinkhof ............... G03F 9/7092 |
| 2018/0348145 A1* | 12/2018 | Witte .................. G03F 7/70191 |
| 2019/0041760 A1* | 2/2019 | Bhattacharyya .... G03F 7/70625 |
| 2021/0271174 A1* | 9/2021 | Hsieh .................. G03F 7/70625 |

FOREIGN PATENT DOCUMENTS

| | | | | |
|---|---|---|---|---|
| WO | WO-2004008068 A1 * | 1/2004 | .......... | G01B 11/272 |
| WO | WO-2018077587 A1 * | 5/2018 | | |

OTHER PUBLICATIONS

WIPO, ISR for International Application No. PCT/US2021/031476, dated Dec. 9, 2021.

* cited by examiner

*Primary Examiner* — Gordon J Stock, Jr.
(74) *Attorney, Agent, or Firm* — Hodgson Russ LLP

(57) ABSTRACT

An optical inspection apparatus includes an illumination assembly, configured to direct optical radiation to illuminate a semiconductor wafer on which first and second patterned layers have been deposited in succession, including a first target feature in the first patterned layer and a second target feature in the second patterned layer, such that at least one of the first and second target features has at least one dimension in the plane of the wafer that is less than an optical diffraction limit of the apparatus. An imaging assembly is configured to capture at least one image of the wafer, and a controller is configured to process the at least one image in order to identify respective locations of the first and second target features in the at least one image and to measure an overlay error between the first and second patterned layers responsively to a displacement between the respective locations.

14 Claims, 4 Drawing Sheets

SUB-RESOLUTION IMAGING TARGET

CROSS-REFERENCE TO RELATED APPLICATION

This application claims the benefit of U.S. Provisional Patent Application 63/162,631, filed Mar. 18, 2021, which is incorporated herein by reference.

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In photolithography, a thin layer of a photosensitive polymer (photoresist) is deposited over a semiconductor wafer and patterned using optical or other radiation, leaving parts of the wafer covered by the photoresist. After patterning, the wafer is modified by methods such as etching and ion bombardment to change the material properties or the topography of the wafer, while the parts of the wafer covered by the photoresist are not affected.

Semiconductor circuit metrology is commonly used for measuring properties of the patterned photoresist, such as the topography and location of the patterned features. Accurate location of the patterned features of the photoresist with respect to previous process layers is crucial for assuring a high yield of the photolithographic process. Any error in the registration (misregistration) of the patterned photoresist with respect to an underlying process layer is referred to as "overlay error." As an example, in typical semiconductor circuits with minimum line-widths of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology tools, as optical radiation in the visible and near-infrared wavelengths is capable of penetrating through the photoresist layer, as well as through dielectric layers under the photoresist. Optical overlay metrology tools, such as the Archer™-series tools by KLA Corporation (Milpitas, Calif., USA), image a proxy target (such as AIM™ overlay target by KLA) located in the scribe lines of the semiconductor wafer (the lines separating adjacent dies). An image analysis algorithm is applied to the acquired images in order to locate the center of symmetry (CoS) of the target features in the process layer and the CoS of the target features in the patterned photoresist layer. The overlay error is computed as the distance between the centers of symmetry of the target features of the two layers.

The terms "optical rays," "optical radiation," "light," and "beams of radiation," as used in the present description and in the claims, refer generally to any and all of visible, infrared, and ultraviolet radiation.

SUMMARY

Embodiments of the present invention that are described hereinbelow provide improved target features and methods for semiconductor circuit metrology.

There is therefore provided, in accordance with an embodiment of the invention, an optical inspection apparatus. The apparatus includes an illumination assembly, configured to direct optical radiation at a selected illumination wavelength to illuminate a semiconductor wafer on which first and second patterned layers have been deposited in succession, including a first target feature in the first patterned layer and a second target feature in the second patterned layer, in proximity to the first target feature. At least one of the first and second target features has at least one dimension in the plane of the wafer that is less than an optical diffraction limit of the apparatus at the illumination wavelength. An imaging assembly is configured to capture at least one image of the semiconductor wafer including the optical radiation that is scattered from the at least one of the first and second target features. A controller is configured to process the at least one image in order to identify respective locations of the first and second target features in the at least one image and to measure an overlay error between the first and second patterned layers responsively to a displacement between the respective locations.

In the disclosed embodiments, the at least one dimension is no greater than 100 nm and may be less than 50 nm.

In some embodiments, at least one of the first and second target features has two orthogonal dimensions in the plane of the wafer that are less than the optical diffraction limit of the apparatus at the illumination wavelength. Additionally or alternatively, both of the first and second target features have respective dimensions in the plane of the wafer that are less than the optical diffraction limit of the apparatus at the illumination wavelength.

In some embodiments, the controller is configured to process the scattered optical radiation responsively to a point spread function of the imaging assembly in order to find a location of the at least one of the first and second target features. In one embodiment, the controller is configured to find the location by computing a center of mass of the scattered optical radiation in the at least one image. Additionally or alternatively, the controller is configured to find the location by digital filtering of the image using a kernel corresponding to an optical transfer function of the imaging assembly.

In further embodiments, the at least one image is a scatterometric image indicative of an angular distribution of the optical radiation that is scattered from the at least one of the first and second target features, and the controller is configured to process the angular distribution in order to measure the overlay error.

There is also provided, in accordance with an embodiment of the invention, a method for optical metrology. The method includes directing optical radiation at a selected illumination wavelength to illuminate a semiconductor wafer on which first and second patterned layers have been deposited in succession, including a first target feature in the first patterned layer and a second target feature in the second patterned layer, in proximity to the first target feature. At least one of the first and second target features has at least one dimension in the plane of the wafer that is less than an optical diffraction limit of the apparatus at the illumination wavelength. The method further includes capturing at least one image of the semiconductor wafer including the optical radiation that is scattered from the at least one of the first and second target features, and processing the at least one image in order to identify respective locations of the first and second target features in the at least one image and measuring an overlay error between the first and second patterned layers responsively to a displacement between the respective locations.

The present invention will be more fully understood from the following detailed description of the embodiments thereof, taken together with the drawings in which:

DETAILED DESCRIPTION OF EMBODIMENTS

Overview

Figure 1:
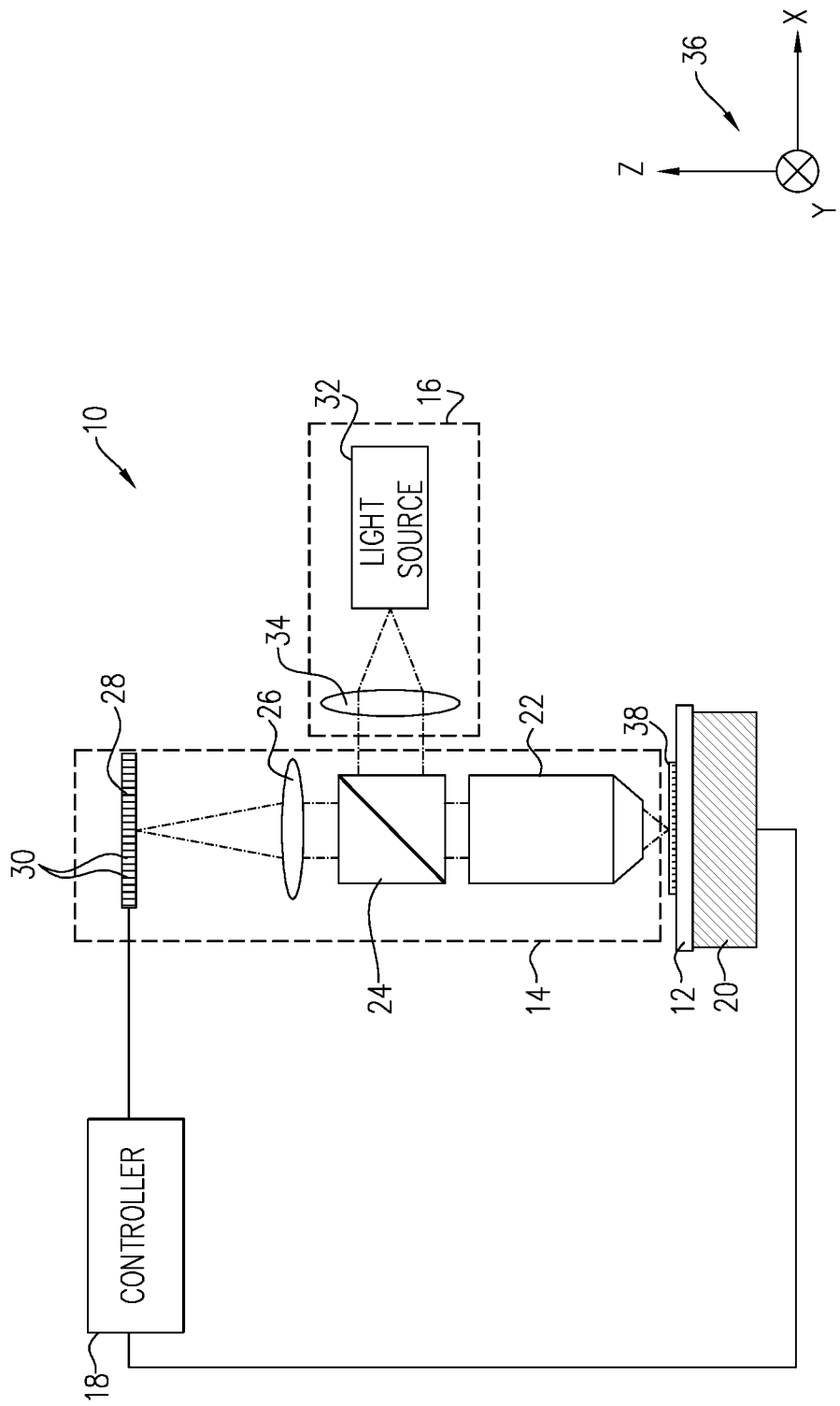
FIG. 1 is a schematic side view of an optical inspection apparatus for measuring overlay error on a semiconductor wafer, in accordance with an embodiment of the invention.

Proxy targets for overlay metrology are commonly used for precise and accurate measurements of the overlay error between successive patterned layers on a semiconductor wafer. These layers may comprise, for example, a process layer and a resist layer, or, in after-etch applications, two process layers. Thus, although some example embodiments are described below with reference to a process layer and a resist layer, the principles of these embodiments may be applied, mutatis mutandis, to a first process layer and a second process layer.

However, the commonly used features in the proxy targets, including both resist and process layer target features, have dimensions that are one to two orders of magnitude larger than the features printed in the device area of the die. For example, typical feature dimensions (line-widths and pitches) in currently used proxy targets are 450 nm or larger so as to be resolvable by metrology tools operating in the visible or near-infrared spectrum of light, whereas the lithography process is optimized for device features that are less than 80 nm and for leading-edge processes less than 10 nm. This kind of dimensional discrepancy causes the features of the proxy targets to react to lithographic process effects differently from the device features in the die, and the overlay error measured on a proxy target may have an offset with respect to the overlay error of the actual device features. Moreover, these large-size features cause the overall dimensions of the proxy targets to be 5 μm or more, which prevents inserting the targets within the device area itself, thus hampering efforts to accurately gauge the overlay errors within the device area.

The embodiments of the present invention that are described herein address these problems by providing proxy targets with much smaller features, having dimensions in the same range as the device features on the wafers. Thus, the target features in the proxy targets in one or both of the patterned layers have at least one dimension in the plane of the wafer that is less than the optical diffraction limit of the optical inspection apparatus that is used to measure the feature locations on the wafer (at the illumination wavelength that is used in the apparatus). Because of these very small dimensions of the target features, the apparatus is unable to resolve the actual features in images of the wafer. Instead, a controller processes the images, including the pattern of optical radiation that is scattered from the target features, in order to identify the respective locations of the target features in the overlaid patterned process layers. By analyzing the scatter pattern, the controller estimates the actual locations of the target features and thus measures the overlay error between the layers based on the displacement between the respective locations.

In embodiments of the present invention, the target features may advantageously be reduced to the minimal size that will give a usable signal in the images captured by the inspection apparatus. Typically, at least one dimension of the target features is no greater than 100 nm, or possibly less than 50 nm. In some embodiments, the target features have two orthogonal dimensions in the plane of the wafer that are less than the optical diffraction limit. Alternatively, one of the dimensions may be sub-diffraction limit while the other dimension is larger. In any case, the target features can be printed using the same process as is used to fabricate the actual semiconductor devices on the wafer and occupy less real estate than conventional overlay targets. The small dimensions of the target features also make it possible to print them in the device are of the dies, instead of or in addition to the conventional practice of printing them in the scribe lines.

Since at least one of the dimensions of the target features is below the diffraction limit, the images of these features that are captured by the optical inspection apparatus are broadened by diffraction, according to the local point-spread function (PSF) of the optics in the apparatus. The controller processes the optical radiation scattered from the target features on the basis of this PSF in order to find the location coordinates of the target features. For this purpose, for example, the controller may compute the center-of-mass of the scattered optical radiation, or it may apply digital filtering to the image using a kernel corresponding to an optical transfer function of the optics. The controller finds the distance between the extracted coordinates of the target features in the two patterned layers that are under inspection and compares this distance to the nominal (design) offset between the position coordinates of these two features in order to find the overlay error.

Because the images of the target features are intentionally defocused, the measurement of the location coordinates of the features is less sensitive to focus than in conventional methods of measuring overlay error. When the locations of the target features in the two layers are offset relative to one another, it is possible to capture images of the target features in both the upper and lower patterned layers in a single frame, rather than requiring two separate images at two different focal settings. This approach can both streamline the measurement process and improve its precision.

Optical Inspection Apparatus

FIG. 1 is a schematic side view of an optical inspection apparatus 10 for measuring overlay error on a semiconductor wafer 12, in accordance with an embodiment of the invention.

Optical inspection apparatus 10 comprises an imaging assembly 14, an illumination assembly 16, a controller 18, and a table 20 on which wafer 12 is mounted. Imaging assembly 14 comprises an objective lens 22, a cube beam-splitter 24, and an imaging lens 26. Imaging assembly 14 further comprises a two-dimensional sensor array 28, comprising for example, a complementary metal-oxide-semiconductor (CMOS) detector with a two-dimensional array of pixels 30.

Illumination assembly 16 comprises a light source 32, emitting optical radiation, and a lens 34. Table 20 is located in proximity to objective lens 22, and comprises actuators, controlled by controller 18, which can move the table linearly in x-, y-, and z-directions (with reference to Cartesian coordinates 36), as well as rotate the table around the z-axis. Cartesian coordinates 36 are shown also in FIGS. 2-3 in order to clarify the orientation of these figures with respect to apparatus 10.

In the pictured embodiment, a photoresist 38 has been deposited over semiconductor wafer 12 and patterned in a photolithographic process. To measure the overlay error between the pattern in photoresist 38 and the pattern in the underlying process layer on wafer 12, target features, as shown in the figures that follow, have been formed by processes of photolithography in the photoresist and the underlying process layer. Wafer 12 is positioned on table 20 so that the combined optics of lens 22 and lens 26 image the wafer onto sensor array 28, i.e., the wafer and the sensor array are located at optical conjugate planes. Lenses 22 and 26 (possibly in conjunction with other optical elements in imaging assembly 14) define the numerical aperture (NA) of the imaging assembly, as is known in the art. For the selected illumination wavelength $\lambda$ of illumination assembly 16, the optical diffraction limit of apparatus 10 is defined in the accepted manner as $d=\lambda/2NA$. As noted earlier, some or all of the dimensions of the target features used in apparatus 10 are smaller than this diffraction limit.

Controller 18 is coupled to sensor array 28 and to table 20. Controller 18 typically comprises a programmable processor, which is programmed in software and/or firmware to carry out the functions that are described herein, along with suitable digital and/or analog interfaces for connection to the other elements of apparatus 10. Alternatively or additionally, controller 18 comprises hard-wired and/or programmable hardware logic circuits, which carry out at least some of the functions of the controller. Although controller is shown in FIG. 1, for the sake of simplicity, as a single, monolithic functional block, in practice the controller may comprise multiple, interconnected control units, with suitable interfaces for receiving and outputting the signals that are illustrated in the figures and are described in the text. Program code or instructions for the controller 18 to implement various methods and functions disclosed herein may be stored in readable storage media, such as a memory in the controller 18 or other memory.

To capture an image of target features on semiconductor wafer 12, light source 32 projects a beam of optical radiation at the selected illumination wavelength to lens 34, which further projects the beam to cube beamsplitter 24. Beamsplitter 24 reflects the beam into objective lens 22, which projects the beam onto wafer 12. The radiation impinging on wafer 12 is scattered back to objective lens 22 and passed on to beamsplitter 24, transmitted to lens 26, and focused onto sensor array 28. Controller 18 reads out the images captured by sensor array 28 and processes the images in order to identify respective locations of the target features in photoresist 38 and in the underlying process layer on wafer 12. Controller 28 measures the overlay error between these two patterned layers based on the displacement between the respective locations of the target features.

Alternatively, apparatus 10 may be configured for measuring overlay error in a scatterometry mode. For this mode, lens 26 is modified and/or moved so as to image the exit pupil (not shown) of objective lens 22 onto sensor array 28. This scatterometric image is indicative of the angular distribution of the optical radiation that is scattered from the target features, and controller 18 in this case is configured to process the angular distribution in order to measure the overlay error.

Target Features

Figure 2B:
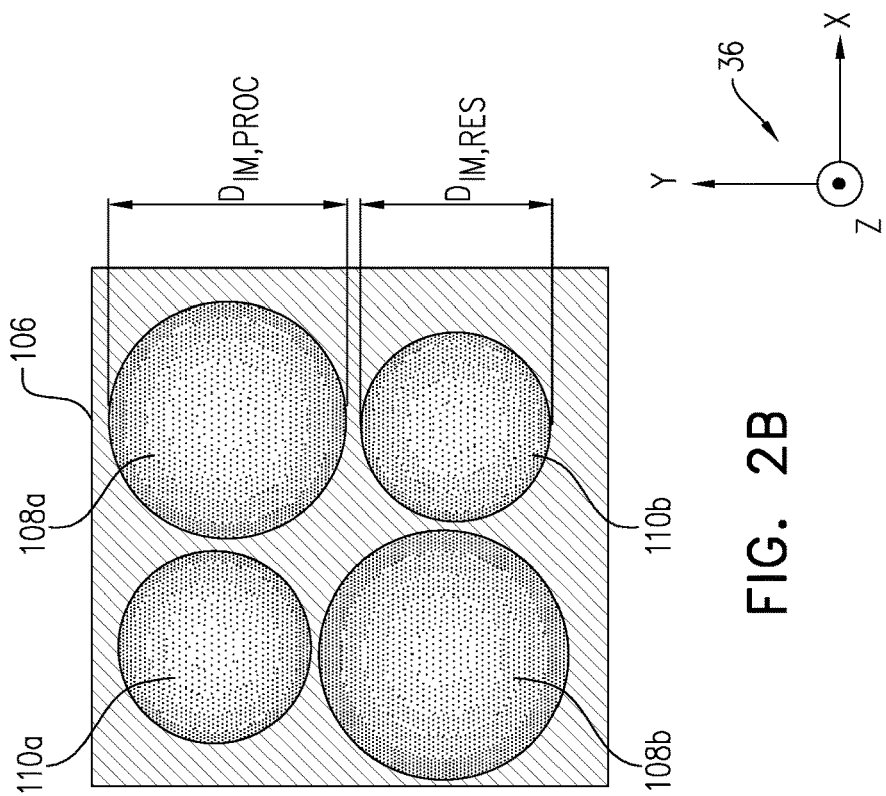
FIGS. 2a and 2b are schematic illustrations of target features of an overlay proxy target as printed on a semiconductor wafer and as imaged by an optical inspection apparatus, respectively, in accordance with an embodiment of the invention.
Figure 2A:
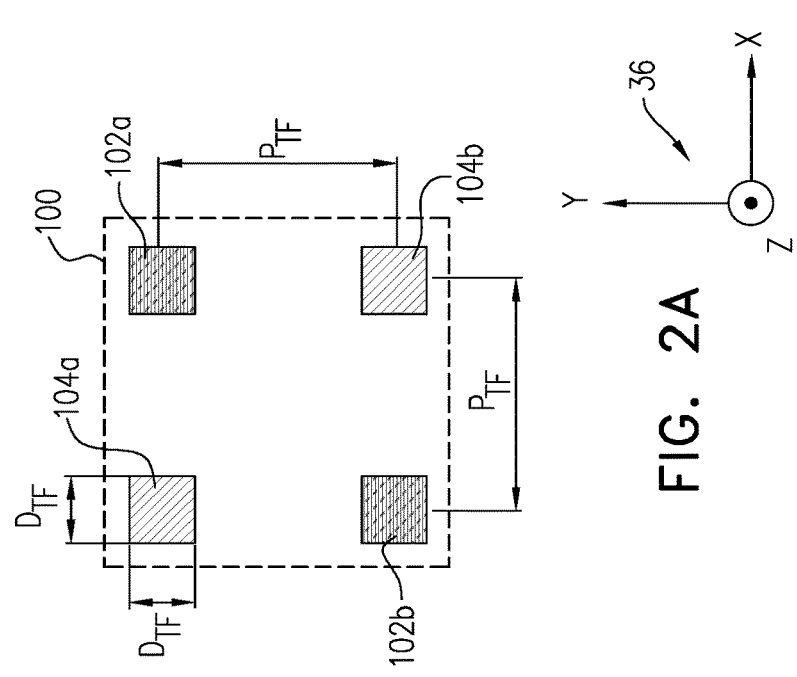

FIGS. 2a and 2b are schematic illustrations of target features of an overlay proxy target 100 as printed on wafer and as imaged by optical inspection apparatus 10, respectively, in accordance with an embodiment of the invention.

FIG. 2a shows printed overlay proxy target 100 as viewed from the z-direction (with reference to Cartesian coordinates 36). Proxy target 100 comprises target features 102a and 102b formed in the process layer of wafer 12 and target features 104a and 104b formed in the overlying layer of photoresist 38. Target features 102a-102b and 104a-104b, fabricated in the lithographic process, comprise squares each having a side-length $D_{TF}$, with the squares positioned at a pitch of $P_{TF}$ in both x- and y-directions (with subscript TF referring to target feature). Typically, side-length $D_{TF}$ is no greater than 100 nm, and may possibly be less than 50 nm. For example, in one disclosed embodiment, side-length $D_{TF}$ is 80 nm, and pitch $P_{TF}$ is 1 µm.

Side-length $D_{TF}$ of target features 102a-102b and 104a-104b is either similar to or larger than typical device feature sizes fabricated by the lithographic process, and the target features will therefore print in their true square form. These features are sufficiently small so as to be compatible with the lithographic process and to enable fitting proxy target 100 in the device area if desired. A lower limit for side-length $D_{TF}$ of target features 102a-102b and 104a-104b is determined by the requirement that the target features reflect a sufficient amount of light to be captured by imaging assembly 14, so that the signal-to-noise (S/N) ratio of the captured images will assure a repeatable (precise) measurement of overlay error.

FIG. 2b shows an image 106 of proxy target 100 as captured by imaging assembly 14, in accordance with an embodiment of the invention.

Image 106 comprises images 108a and 108b of target features 102a and 102b in the process layer and images 110a and 110b of target features 104a and 104b in the resist layer. Each of images 108a, 108b, 110a and 110b is formed by a convolution of the actual shape of the target feature with the local point spread function (PSF) of imaging assembly 14. (The "local PSF" includes the effects of optical aberrations and defocus at the location of the specific target feature and may vary over the field of view of the imaging assembly.) For an imaging assembly 14 with ideal optics (zero optical aberrations) and at its nominal focal setting, PSF has the form of an Airy pattern. The width of the Airy pattern for an ideal objective lens 22 with a high numerical aperture (NA) is approximately one wavelength ($\lambda$) of the illuminating optical radiation emitted by light source 16.

The local PSF forming images 108a-108b and 110a-110b is similar to an Airy pattern, but modified by residual field-dependent aberrations of imaging assembly 14 and defocus of the respective target features forming the images. The local PSF may be measured and/or calculated explicitly for different locations in the field of view of imaging assembly 14. Additionally or alternatively, controller 18 may apply a process of iterative optimization in processing image 106 in order to compensate for variations in the local PSF.

Image 106 in the present example is captured with imaging assembly 14 focused on photoresist layer 38. As target features 104a-104b have dimensions that are much smaller than the typical wavelength $\lambda$ of the illuminating radiation ($\lambda \geq 450$ nm), and as imaging assembly 14 typically comprises high-quality optics, images 110a-110b comprise circular spots with a diameter of $D_{IM,RES}$, which is (approximately) $\lambda$, and with an intensity that is maximal at the center of the spot and decays towards its edges. Images 108a-108b of target features 102a-102b in the underlying process layer are similarly circular spots with a centrally peaked intensity distribution. However, their diameter $D_{IM,PROC}$ is larger than $D_{IM,RES}$ because the process layer is vertically displaced from the resist layer, thus broadening the spot.

Both images 108a-108b and images 110a-110b are processed, as described hereinbelow, without a need to re-focus imaging assembly 14 between the capture of the images from the process and resist layers, thus streamlining the measurement process (shortening the measurement time) and improving its precision. Alternatively or additionally, separate, focused images may be captured of target features 102a and 102b and of target features 104a and 104b, at different focus settings of imaging assembly 14.

In order to extract the locations of target features 102a-102b and 104a-104b in the xy-plane on wafer 12 (taking into account the magnification of imaging assembly 14), controller 18 performs digital filtering of image 106 using a kernel corresponding to the optical transfer function of the imaging assembly. For example, controller 18 may apply a two-dimensional deconvolution to each of images 108a-108b and 110a-110b with the local PSF of imaging assembly 14 as the deconvolution kernel. The deconvolution may be performed as a process of iterative optimization in order to minimize the size and/or maximize the contrast of the target feature extracted following deconvolution.

As an alternative to deconvolution, controller 18 extracts the locations of target features 102a-102b and 104a-104b in the xy-plane simply by computing the center-of-mass (first moment of the intensity distribution) of each of images 108a-108b and 110a-110b. The controller uses these centers-of-mass as the location coordinates of the respective target features.

Using the locations of the extracted target features, controller 18 computes the overlay error between the resist layer and the process layer. For the computation, the measured center coordinates of target feature 102a in the xy-plane are denoted by [x(102a), y(102a)], with the same notation used for the other target features. The nominal locations of the target features are known from the layout of the devices and target features on wafer 12, and are denoted by [$\underline{x}$(102a), $\underline{y}$(102a)] for target feature 102a. The same notation is used for the other target features. Controller 18 computes the overlay errors by comparing the differences between the measured locations (locations computed from the captured images) to the differences between the nominal locations. For example, from the measured locations of the two target features 104a and 102b in the resist layer and the process layer, respectively, controller 18 computes the x- and y-overlay errors $OVL_x$ and $OVL_y$, as:

$OVL_x = [x(104a)-x(102b)] - [\underline{x}(104a)-\underline{x}(102b)]$ and $OVL_y = [y(104a)-y(102b)] - [\underline{y}(104a)-\underline{y}(102b)]$.

For increased precision of the overlay error measurement, image 106 may be captured several times, and controller 18 may average the results over multiple images.

Figure 3A:
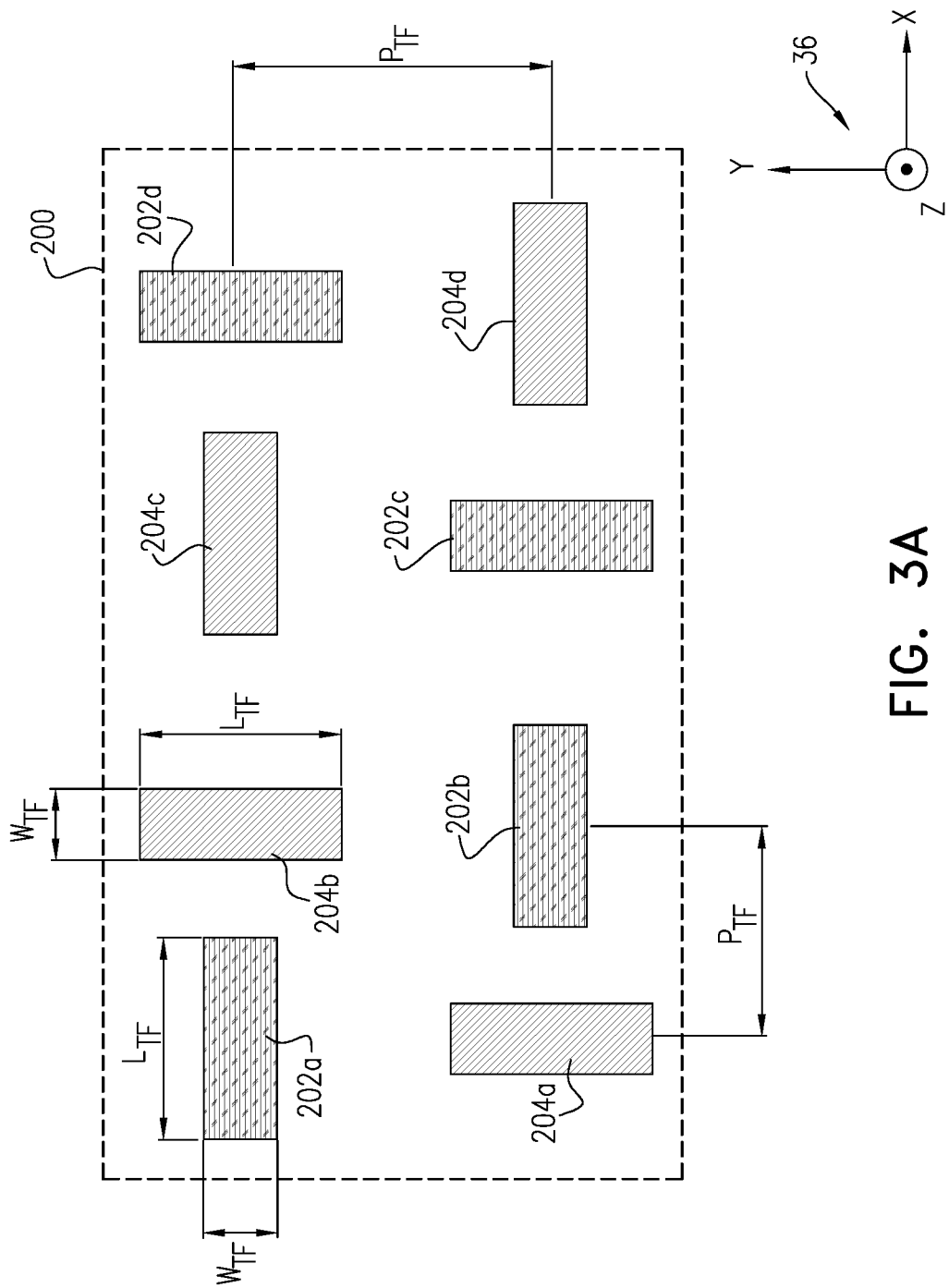
FIGS. 3a and 3b are schematic illustrations of target features of an overlay proxy target as printed on a semiconductor wafer and as imaged by an optical inspection apparatus, respectively, in accordance with another embodiment of the invention.
Figure 3B:
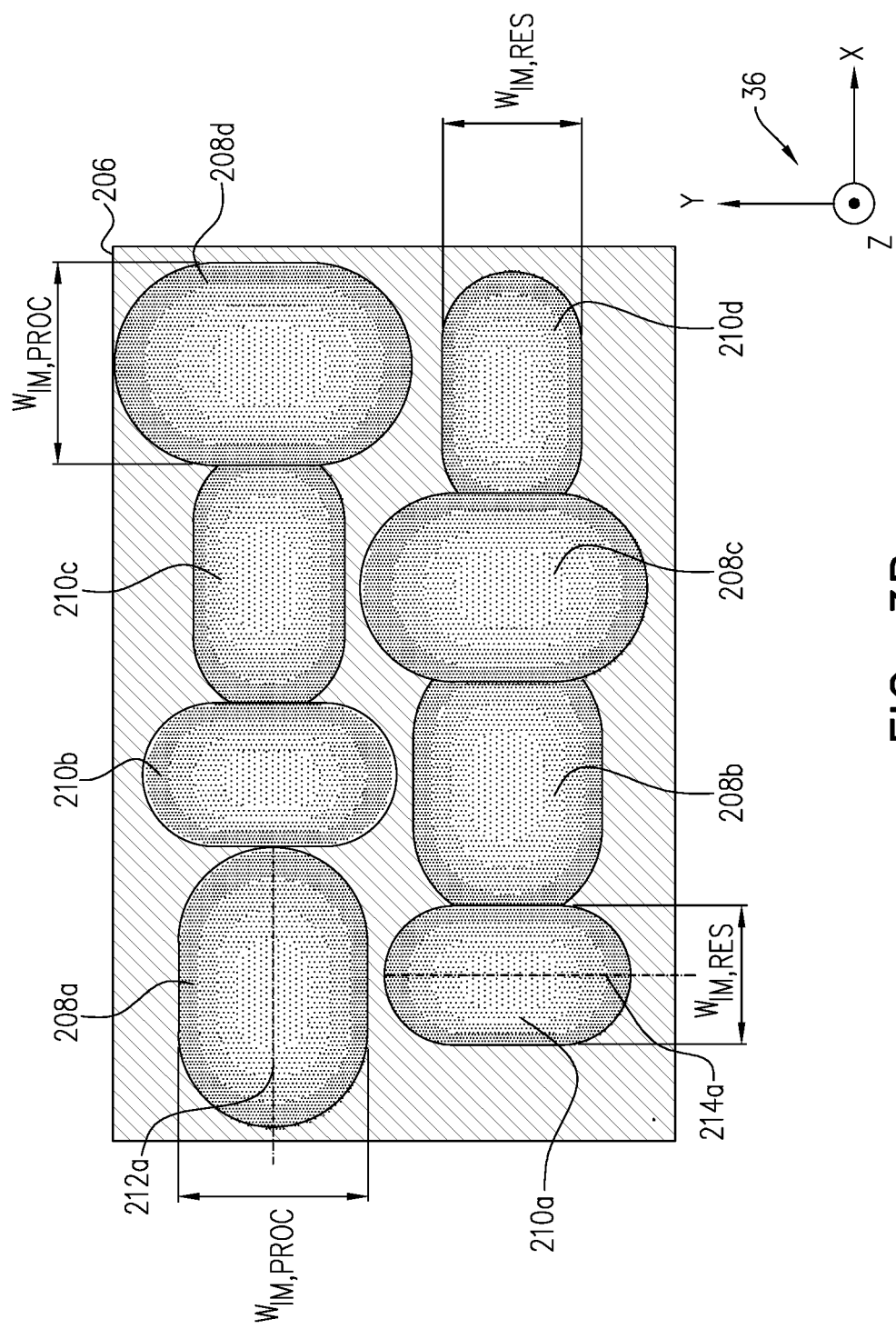

FIGS. 3a and 3b are schematic illustrations of target features of an overlay proxy target 200 as printed on wafer and as imaged by optical inspection apparatus 10, respectively, in accordance with another embodiment of the invention.

FIG. 3a shows printed overlay proxy target 200 as viewed from the z-direction with reference to Cartesian coordinates 36. Proxy target 200 comprises four target features 202a-202d in the process layer of wafer 12 and four target features 204a-204d in the overlying layer of photoresist 38. Target features 202a-202d and 204a-204d comprise lines with a length of $L_{TF}$ and a line-width of $W_{TF}$, wherein the line-width, similarly to side-length $D_{TF}$ in FIG. 3a, is no greater than 100 nm, and may possibly be less than 50 nm. For example, in one embodiment line-width $W_{TF}$ is 80 nm and length $L_{TF}$ is 400 nm. Some of the target features are oriented with their long axis in the x-direction and others with their long axis in the y-direction, with the features positioned with closest center-to-center distances of $P_{TF}=1$ μm in both x- and y-directions. As the line-widths of target features 202a-202d and 204a-204d are much smaller than the wavelength of the optical radiation emitted by light source 32, they are—similarly to target features 102a-102b and 104a-104b (FIG. 2a)—compatible with the lithographic process, and may be placed within the device area. An advantage of these line-shaped target features over the square target features shown in FIG. 2a is their larger surface area and thus a higher reflected optical signal.

FIG. 3b shows an image 206 of proxy target 200 as captured by imaging assembly 14, in accordance with an embodiment of the invention.

Image 206 comprises images 208a-208d of target features 202a-202d, respectively, and images 210a-210d of target features 204a-204d, respectively. Similarly to image 106 (FIG. 2b), image 206 is formed with imaging assembly 14 focused on photoresist layer 38. As line-width $W_{TF}$ of target features 204a-204d is much smaller than the typical wavelength of the illuminating radiation ($\lambda \geq 450$ nm), images 210a-210d are broadened due to diffraction to a width $W_{IM,RES}$, which is (approximately) $\lambda$, and have an intensity that is maximal along the center of the line and decays towards its edges. (The lengths of images 210a-210 are similarly increased due to diffraction, but as is discussed hereinbelow, this increase is not relevant for the extracted locations.)

Images 208a-208d are similarly broadened by diffraction, but in addition they are further broadened by defocus due to the vertical displacement of the process layer from the resist layer to a width $W_{IM,PROC}$ that is larger than $W_{IM,RES}$.

Similarly to the description hereinabove (FIG. 2b), there is no need to re-focus imaging assembly 14 between the capture of the images from the process and resist layers, thus streamlining the measurement process (shortening the measurement time) and improving its precision.

For the line-shaped target features that are imaged in FIG. 3b, controller 18 extracts the location of the long axis of each feature in a direction transverse to the axis. Thus, for example, from image 208a controller extracts the y-coordinate y(208a) of a long axis 212a, and from image 210a the x-coordinate x(210a) of a long axis 214a. Controller 18 performs these extractions through digital filtering using the optical transfer function of imaging assembly 14, with the filtering comprising one or more deconvolutions across the width of the respective images using the PSF of the imaging assembly as the deconvolution kernel, with the appropriate locations in the xy-plane and defocus.

As an alternative to deconvolution, controller 18 extracts the centers-of-mass of images 208a-208d and images 210a-210d.

Because only one position coordinate is measured for each target feature, x-overlay errors are extracted from the vertical target features, and y-overlay errors are extracted from the horizontal target features. Using the same notation as in FIG. 2b, controller 18 computes $OVL_x$ for example from target features 204a and 202c as $OVL_x=[x(204a)-x(202c)]-[\underline{x}(204a)-\underline{x}(202c)]$ and $OVL_y$ for example from target features 204c and 202b as $OVL_y=[y(204c)-y(202b)]-[\underline{y}(204c)-\underline{y}(202b)]$.

Alternatively or additionally, target features of different dimensions may be selected depending on the application. Thus, thin lines with nominal dimensions of 40 nm×1000 nm are suitable for layers thinner than 1 µm, whereas square structures, such as 80 µm×80 µm squares, are suitable for layers thicker than 1 µm in order to reduce the sensitivity of measurement to the relative defocus of imaging assembly 14 between the layers. Grating-like target features with sub-features comprising sub-resolution lines (line-widths less than the optical diffraction limit of the apparatus at the illumination wavelength) may be used in proxy targets for scatterometric overlay error measurement, wherein the overlay error is computed from the angular distribution of optical radiation scattered from the gratings.

In alternative embodiments, target features of other shapes and dimensions (below the diffraction limit) may be used. For example, the target design for a given pair of process layers can be optimized by simulating the image of the target features as it will appear in the image captured by imaging assembly 14, and then printing the target features in the form that is found to yield optimal accuracy in location measurement.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An optical inspection apparatus comprising:
    an illumination assembly configured to direct optical radiation at a selected illumination wavelength to illuminate a semiconductor wafer on which first and second patterned layers have been deposited in succession, including a first target feature in the first patterned layer and a second target feature in the second patterned layer in proximity to the first target feature, such that at least one of the first target feature and the second target feature has at least one dimension in a plane of the wafer that is less than an optical diffraction limit of the apparatus at the illumination wavelength;
    an imaging assembly configured to capture at least one image of the semiconductor wafer including the optical radiation that is scattered from the at least one of the first target feature and the second target feature; and
    a controller configured to process the at least one image in order to identify respective locations of the first target feature and the second target feature in the at least one image and to measure an overlay error between the first and second patterned layers responsively to a displacement between the respective locations, wherein the controller is configured to process the scattered optical radiation responsively to a point spread function of the imaging assembly in order to find a location of the at least one of the first target feature and the second target feature, and wherein the controller is configured to find the location by digital filtering of the image using a kernel corresponding to an optical transfer function of the imaging assembly.

2. The apparatus according to claim 1, wherein the at least one of the first target feature and the second target feature has two orthogonal dimensions in the plane of the wafer that are less than the optical diffraction limit of the apparatus at the illumination wavelength.

3. The apparatus according to claim 1, wherein both of the first target feature and the second target feature have respective dimensions in the plane of the wafer that are less than the optical diffraction limit of the apparatus at the illumination wavelength.

4. The apparatus according to claim 1, wherein the controller is further configured to find the location by computing a center of mass of the scattered optical radiation in the at least one image.

5. The apparatus according to claim 1, wherein the at least one image is a scatterometric image indicative of an angular distribution of the optical radiation that is scattered from the at least one of the first target feature and the second target feature, and the controller is configured to process the angular distribution in order to measure the overlay error.

6. The apparatus according to claim 1, wherein the at least one dimension is no greater than 100 nm.

7. The apparatus according to claim 6, wherein the at least one dimension is less than 50 nm.

8. A method for metrology, comprising:
    directing optical radiation at a selected illumination wavelength to illuminate a semiconductor wafer on which first and second patterned layers have been deposited in succession, including a first target feature in the first patterned layer and a second target feature in the second patterned layer in proximity to the first target feature, such that at least one of the first target feature and the second target feature has at least one dimension in a plane of the wafer that is less than an optical diffraction limit of the apparatus at the illumination wavelength;
    capturing at least one image of the semiconductor wafer including the optical radiation that is scattered from the at least one of the first target feature and the second target feature; and
    processing the at least one image in order to identify respective locations of the first target feature and the second target feature in the at least one image and measuring an overlay error between the first and second patterned layers responsively to a displacement between the respective locations, wherein processing the at least one image comprises processing the scattered optical radiation responsively to a point spread function of an imaging assembly used in capturing the at least one image in order to find a location of the at least one of the first target feature and the second target feature, and wherein processing the scattered optical radiation comprises finding the location by digital filtering of the image using a kernel corresponding to an optical transfer function of the imaging assembly.

9. The method according to claim 8, wherein the at least one of the first target feature and the second target feature has two orthogonal dimensions in the plane of the wafer that are less than the optical diffraction limit of the apparatus at the illumination wavelength.

10. The method according to claim 8, wherein both of the first target feature and the second target feature have respective dimensions in the plane of the wafer that are less than the optical diffraction limit of the apparatus at the illumination wavelength.

11. The method according to claim 8, wherein processing the scattered optical radiation further comprises finding the location by computing a center of mass of the scattered optical radiation in the at least one image.

12. The method according to claim 8, wherein capturing the at least one image comprises capturing a scatterometric image indicative of an angular distribution of the optical radiation that is scattered from the at least one of the first target feature and the second target feature, and wherein processing the at least one image comprises processing the angular distribution in order to measure the overlay error.

13. The method according to claim 8, wherein the at least one dimension is no greater than 100 nm.

14. The method according to claim 13, wherein the at least one dimension is less than 50 nm.

* * * * *